(12) United States Patent
Nakagawa

(10) Patent No.: US 6,790,718 B1
(45) Date of Patent: Sep. 14, 2004

(54) METHOD OF MANUFACTURING SEMICONDUCTOR MEMORY DEVICE INCLUDING ONE STEP OF FORMING EXPOSING THE SURFACE OF THE SELECT TRANSISTORS WHILE NOT EXPOSING THE SURFACE CELL TRANSISTORS

(75) Inventor: Kenichiro Nakagawa, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/688,203

(22) Filed: Oct. 16, 2000

(30) Foreign Application Priority Data

Oct. 18, 1999 (JP) .......................................... 11/295885

(51) Int. Cl.[7] .................. H01L 21/337; H01L 21/8234; H01L 21/336; H01L 21/425

(52) U.S. Cl. ...................... 438/195; 138/257; 138/266; 138/275; 138/514

(58) Field of Search ............................... 438/195, 257, 438/266, 275, 514, 258, 259, 260, 261, 262, 263, 264, 265, 267

(56) References Cited

U.S. PATENT DOCUMENTS 5,683,923 A * 11/1997 Shimizu et al.
5,824,584 A * 10/1998 Chen et al. ................. 438/267
5,943,262 A * 8/1999 Choi ..................... 365/185.17
6,265,739 B1 * 7/2001 Yaegashi et al. ............ 257/296

FOREIGN PATENT DOCUMENTS

| JP | 02-151073 | 6/1990 |
| JP | 08-046159 | 2/1996 |
| JP | 08-148658 | 6/1996 |
| JP | 10-326881 | 12/1998 |
| JP | 11-233652 | 8/1999 |

OTHER PUBLICATIONS

Japanese Office Action dated Mar. 12, 2003 with partial English translation.

* cited by examiner

Primary Examiner—George Fourson
Assistant Examiner—William M. Brewster
(74) Attorney, Agent, or Firm—McGinn & Gibb, PLLC

(57) ABSTRACT

A semiconductor memory device capable of electrically writing and erasing data has a plurality of cell transistors for storing data, each of the cell transistors having a floating gate electrode and a control gate electrode, and a plurality of select transistors for controlling and selecting the cell transistors. Before the control gate electrodes of the cell transistors are formed, the surface of a substrate directly above channel regions of the select transistors fabricated in the same process as the cell transistors is exposed, and gate insulating films of the select transistors are formed on the exposed surface of the substrate. The control gate electrodes of the cell transistors are formed, and gate electrodes of the select transistors are formed on the gate insulating films.

18 Claims, 11 Drawing Sheets

SELECT TRANSISTOR

CELL TRANSISTOR

SELECT TRANSISTOR          CELL TRANSISTOR

SELECT TRANSISTOR          CELL TRANSISTOR

SELECT TRANSISTOR          CELL TRANSISTOR

SELECT TRANSISTOR

CELL TRANSISTOR

SELECT TRANSISTOR

CELL TRANSISTOR

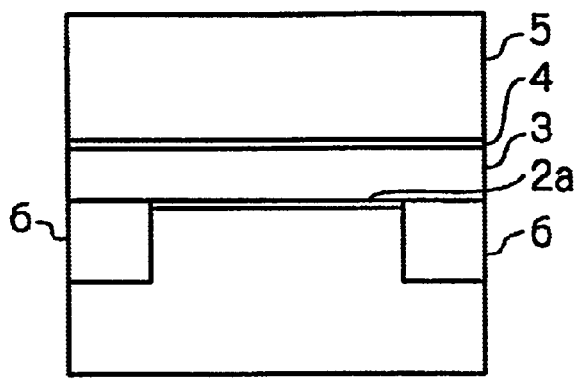
F I G. 20
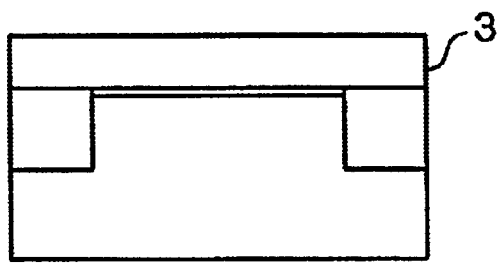
F I G. 21
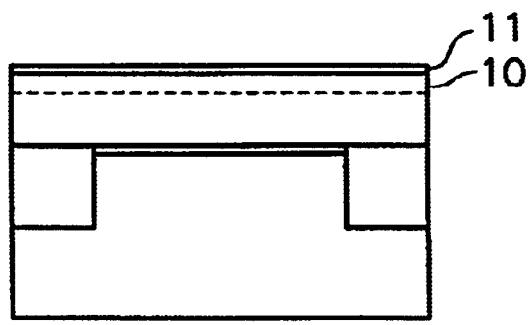
F I G. 22

Vcc-driven TRANSISTOR

High-withstand-voltage TRANSISTOR

Vcc-driven TRANSISTOR

High-withstand-voltage TRANSISTOR

METHOD OF MANUFACTURING SEMICONDUCTOR MEMORY DEVICE INCLUDING ONE STEP OF FORMING EXPOSING THE SURFACE OF THE SELECT TRANSISTORS WHILE NOT EXPOSING THE SURFACE CELL TRANSISTORS

BACKGROUND OF THE INVENTION

1. Field of the Invention

The present invention relates to a method of manufacturing a semiconductor memory device, and more particularly to a method of manufacturing a semiconductor memory device such as a flash EEPROM (Electrical erasable programable read only memory) capable of electrically writing and erasing data, and such a semiconductor memory device.

2. Description of the Related Art

Flash EEPROMs, or nonvolatile semiconductor memory devices capable of electrically writing and erasing data, have a plurality of cell transistors disposed in a memory cell assembly for storing data and having floating gate electrodes and control gate electrodes, and a plurality of select transistors disposed in the memory cell assembly for selecting the cell transistors. In more practical flash EEPROMs, the transistors of a peripheral circuit such as a logic operation circuit are disposed on the same substrate as the cell and select transistors.

One known flash EEPROM comprises parallel arrays of cell transistors connected to respective data lines for writing and reading data, and a plurality of select transistors connected in series with the respective arrays of cell transistors, as shown in FIG. 1 of the accompanying drawings. The flash EEPROM shown in FIG. 1 has a small device area and can be manufactured in a relatively small number of fabrication steps though the speed at which memory cells are accessed is not significantly high. Therefore, the flash EEPROM shown in FIG. 1 is used as memories for IC cards, for example, which need to be highly integrated and low in cost.

The flash EEPROM shown in FIG. 1 as an example of a conventional semiconductor memory device and a method of manufacturing same will be described below.

The flash EEPROM shown in FIG. 1 has a memory cell assembly comprising a plurality of cell transistors M101–M164, M201–M264, M301–M364, M401–M464 arranged in a grid pattern. The memory cell assembly is divided into a plurality of blocks each comprising a predetermined number of (64 in FIG. 1) cell transistors, parallel to data lines D1–D4. In each of the blocks, the cell transistors have respective sources connected in common and respective drains connected in common. The cell transistors are also arranged in transverse arrays across the data lines, and the cell transistors in those transverse arrays have respective control gate electrodes connected in common to word lines W1–W64 for selecting positions to storing data.

Each of the blocks has two select transistors for selecting a predetermined number of parallel-connected cell transistors. First select transistors Q11, Q21, Q31, Q41 shown in FIG. 1 are inserted between the drains of the cell transistors and respective contacts J1–J4 on the data lines, and second select transistors Q12, Q22, Q32, Q42 shown in FIG. 1 are inserted between the sources of the cell transistors and common source CS kept at ground potential. The first select transistors in the respective blocks have gate electrodes connected in common to first selection gate line SG1, and the second select transistors in the respective blocks have gate electrodes connected in common to second selection gate line SG2.

As shown in FIG. 2 of the accompanying drawings, the blocks of the memory cell assembly are separated by a field oxide film. The cell transistors, represented by M101–M164, M201–M264 in FIG. 2, have source regions S and drain regions D formed in common in the respective blocks. Those common source regions S and drain regions D are also used as interconnections connecting the cell transistors parallel to each other in each of the blocks.

Floating gate electrodes (not shown) and control gate electrodes are disposed at spaced intervals on and across source regions S and drain regions D. The control gate electrodes are connected in common in respective transverse arrays in FIG. 2, and also used as the word lines. Regions directly below the control gate electrodes sandwiched between the source regions and the drain regions serve as channel regions where currents flow.

The drain regions of the cell transistors have ends connected to source regions S of the first select transistors, which are represented by Q11, Q21 in FIG. 2. The first select transistors have respective drain regions D that are positioned across first selection gate line SG1 from source regions S of the first select transistors. The contacts, which are represented by J1, J2 in FIG. 2, for connection to the data lines are disposed on drain regions D of the first select transistors. Though the second select transistors are omitted from the illustration in FIG. 2, the second select transistors are arranged in the same manner as the first select transistors and connected to ends of the source regions of the cell transistors.

For writing or erasing data, a cell transistor is selected at the point of intersection of a data line and a word line to which certain voltages are applied. The data is stored in or erased from the selected cell transistor by a charge introduced into or removed from the floating gate electrode of the selected cell transistor. The data stored in the cell transistor is read by detecting a change in a threshold voltage that is caused by introducing a charge into the floating gate electrode of the selected cell transistor.

A conventional method of manufacturing the flash EEPROM shown in FIGS. 1 and 2 will be described below with reference to FIGS. 3 through 10 of the accompanying drawings. The structure of a select transistor shown in FIGS. 3 through 10 is taken along line A–A' of FIG. 2, and the structure of a cell transistor shown in FIGS. 3 through 10 is taken along line B–B' of FIG. 2.

First, a thin $SiO_2$ film and a silicon nitride ($Si_3N_4$) film is formed on substrate 101 of p-type semiconductor and patterned to a predetermined shape, and its openings are selectively oxidized to form field oxide film 106 as an inactive region for separating components. Then, gate insulating film 102a of the select transistor and tunneling oxide film 102b of the cell transistor are grown on the surface of substrate 101 by thermal oxidation. At this time, since the select transistor requires a high withstand voltage, the following multi-oxidizing process is performed: First, the surface of substrate 101 is thermally oxidized in order to form an oxide film thinner than a desired film thickness. The thickness of the oxide film is smaller than the desired film thickness by a thickness which will be added when tunneling oxide film 102b is subsequently to be formed.

Then, a photoresist is formed in the select transistor area, and the oxide film in the cell transistor area is etched away. Thereafter, the photoresist is removed, and the assembly is thermally oxidized until the oxide film in the cell transistor area gains a desired film thickness, growing the gate insulating film 102a of the select transistor and tunneling oxide film 102b of the cell transistor to respective desired film thicknesses (see FIG. 3).

Then, first N-type polysilicon film 103, which serves as the floating gate electrode of the cell transistor, is grown on the surface formed so far. Pad oxide film 104 is grown on first N-type polysilicon film 103 by CVD (Chemical Vapor Deposition), and second N-type polysilicon film 105 is grown on pad oxide film 104. Second N-type polysilicon film 105 will be used only as a mask in a subsequent ion implantation step. Therefore, second N-type polysilicon film 105 may be replaced with an amorphous silicon film or a silicon nitride film.

Then, first N-type polysilicon film 103, pad oxide film 104, and second N-type polysilicon film 105 are patterned to respective shapes. The width of first N-type polysilicon film 103 which is formed at this time determines the channel widths of the cell transistor and the select transistor (see FIG. 4).

Using second N-type polysilicon film 105 as a mask, an impurity of arsenic (As), for example, is introduced into substrate 101 by way of ion implantation, and thermally diffused to form source region 107 and drain region 108 of the cell transistor and the select transistor (see FIG. 5).

Then, over-the-diffused-layer oxide film 109 (see FIG. 6) in the form of a silicon oxide ($SiO_2$) film is grown by plasma CVD so as to fill up regions alongside of first N-type polysilicon film 103, pad oxide film 104, and second N-type polysilicon film 105.

Thereafter, the upper surface of over-the-diffused-layer oxide film 109 is planarized by a CMP (Chemical Mechanical Polishing) process and an etchback process, exposing second N-type polysilicon film 105. Depending on how over-the-diffused-layer oxide film 109 fills up the above regions, the upper surface of over-the-diffused-layer oxide film 109 may only be etched back without the CMP process. Second N-type polysilicon film 105 and pad oxide film 104 are etched away, exposing the surface of first N-type polysilicon film 103 (see FIG. 7). Prior to this step, over-the-diffused-layer oxide film 109 alongside of first N-type polysilicon film 103 may be etched to adjust its height.

Then, third N-type polysilicon film 110 which serves as an upper portion of the floating gate electrode of the cell transistor is grown on first N-type polysilicon film 103. A photoresist is formed in the cell transistor area, and an impurity of phosphorus (P) or the like is introduced into first N-type polysilicon film 103 and third N-type polysilicon film 110 in the cell transistor area by way of ion implantation. In order to increase the capacitance between the floating gate electrode and a control gate electrode which will subsequently be formed, third N-type polysilicon film 110 in the cell transistor area is patterned to a wing shape, and ONO (Oxide Nitride Oxide) film 111 is grown on the patterned third N-type polysilicon film 110 by CVD (see FIG. 8).

Then, opening 114 is formed in ONO film 111 in the cell transistor area (see FIG. 9), and fourth N-type polysilicon film 112 and metal silicide film 113 of WSi, for example, which will serve as the gate electrode of the select transistor and the control gate electrode of the cell transistor, are grown on ONO film 111. First N-type polysilicon film 103 and fourth N-type polysilicon film 112 are now short-circuited to each other via opening 114.

The cell transistor area and a peripheral circuit area are covered with respective photoresists, and a control gate, ONO film 111, and a floating gate of the cell transistor are patterned simultaneously.

Finally, the cell transistor area is covered with a photoresist, and gate electrodes (fourth N-type polysilicon film 112 and metal silicide film 113) of the select transistor and the transistors of the peripheral circuit are patterned (see FIG. 10). Metal silicide film 113 may not necessarily be formed, but only fourth N-type polysilicon film 112 may be grown. In FIGS. 9 and 10, opening 114 is defined in ONO film 111 directly above the channel region of the cell transistor area. Actually, however, opening 114 is defined in ONO film 111 over field oxide film 106.

With the above conventional semiconductor memory device, since the select transistor and the cell transistor are of an identical structure, it is necessary for the fabrication process to have the step of changing the film thicknesses of the tunneling oxide film of the cell transistor and the gate insulating film of the select transistor which have different withstand voltages, and the step of short-circuiting the first N-type polysilicon film of the select transistor (corresponding to the floating gate of the cell transistor) and the fourth N-type polysilicon film of the select transistor (corresponding to the control gate of the cell transistor). Therefore, the cost of the conventional semiconductor memory device is increased because of the increased number of steps of fabrication process.

The impurity in the polysilicon film used as the gate electrode of the select transistor should preferably be of a high concentration in order to reduce the resistance for high-speed operation, and the impurity in the polysilicon film used as the floating gate electrode of the cell transistor should preferably be of a low concentration in order to prevent a data erasure failure and improve a data retention capability. It is thus necessary for the fabrication process to have the step of changing these impurity concentrations.

One solution is to fabricate the select transistor simultaneously with the transistors of the peripheral circuit, but not with the cell transistor.

However, since the channel width of the transistors of the peripheral circuit generally needs to be managed more accurately than the select transistor, after a gate electrode of the transistors of the peripheral circuit is formed, an impurity is introduced by way of ion implantation using the gate electrode as a mask, forming diffused layers which serve as source and drain regions. Because the diffused layer of the select transistor and the diffused layer of the cell transistor cannot be formed simultaneously, an impurity may be introduced twice into the junction between the diffused layers of the select transistor and the cell transistor, which is also used as an interconnection, resulting in a reduction in the withstand voltage, as shown in FIG. 11A of the accompanying drawings, or an area may be developed where no impurity is introduced, resulting in a disconnection, as shown in FIG. 11B of the accompanying drawings.

SUMMARY OF THE INVENTION

It is therefore an object of the present invention to provide a method of manufacturing a semiconductor memory device to increase the film thickness of a gate insulating film of a select transistor and increase the concentration of an impurity in a polysilicon film used as a gate electrode of a select transistor with a reduced number of fabrication steps.

In a method of manufacturing a semiconductor memory device according to the present invention, before the control gate electrodes of cell transistors are formed, a polysilicon film and an oxide film directly above channel regions of select transistors are removed to expose the surface of a substrate. Thereafter, gate insulating films of the select transistors are formed on the exposed surface of the substrate. Gate electrodes of the select transistors are formed on the gate insulating films simultaneously with control gate electrodes of the cell transistors. In this manner, the control gate electrodes of the cell transistors and the gate electrodes of the select transistors are formed of a single-layer polysilicon film. Consequently, the method is free of the step of short-circuiting two polysilicon films and the step of introducing an impurity in order to reduce the resistance of the polysilicon film which corresponds to floating gate electrodes of the cell transistors. Therefore, the film thickness of the gate insulating films of the select transistors can be increased and the concentration of the impurity in the polysilicon film used as the gate electrodes of the select transistors can be increased with a reduced number of fabrication steps.

A first diffused layer serving as source and drain regions of the cell transistors and a second diffused layer serving as source and drain regions of the select transistors are formed simultaneously. As a result, the junction between the select transistors and the cell transistors is prevented from being cut off, and the impurity is prevented from being introduced twice.

Furthermore, gate insulating films of transistors of a peripheral circuit are formed simultaneously with the gate insulating films of the select transistors, and gate electrodes of the transistors of the peripheral circuit are formed simultaneously with the gate electrodes of the select transistors. Thus, the number of fabrication steps of the method of manufacturing the semiconductor memory device is reduced.

The above and other objects, features, and advantages of the present invention will become apparent from the following description with reference to the accompanying drawings which illustrate examples of the present invention.

BRIEF DESCRIPTION OF THE DRAWINGS

FIGS. 20 through 25 are cross-sectional views showing a process of fabricating transistors of a peripheral circuit, of the method of manufacturing a semiconductor memory device according to the present invention.

DETAILED DESCRIPTION OF THE PREFERRED EMBODIMENTS

A method of manufacturing a semiconductor memory device according to the present invention will be described below with reference to FIGS. 12 through 25. A circuit arrangement and a structure, as viewed in plan, of a flash EEPROM to which the method according to the present invention is applied are identical to those of conventional flash EEPROMs, and will not be described below.

Figure 1:
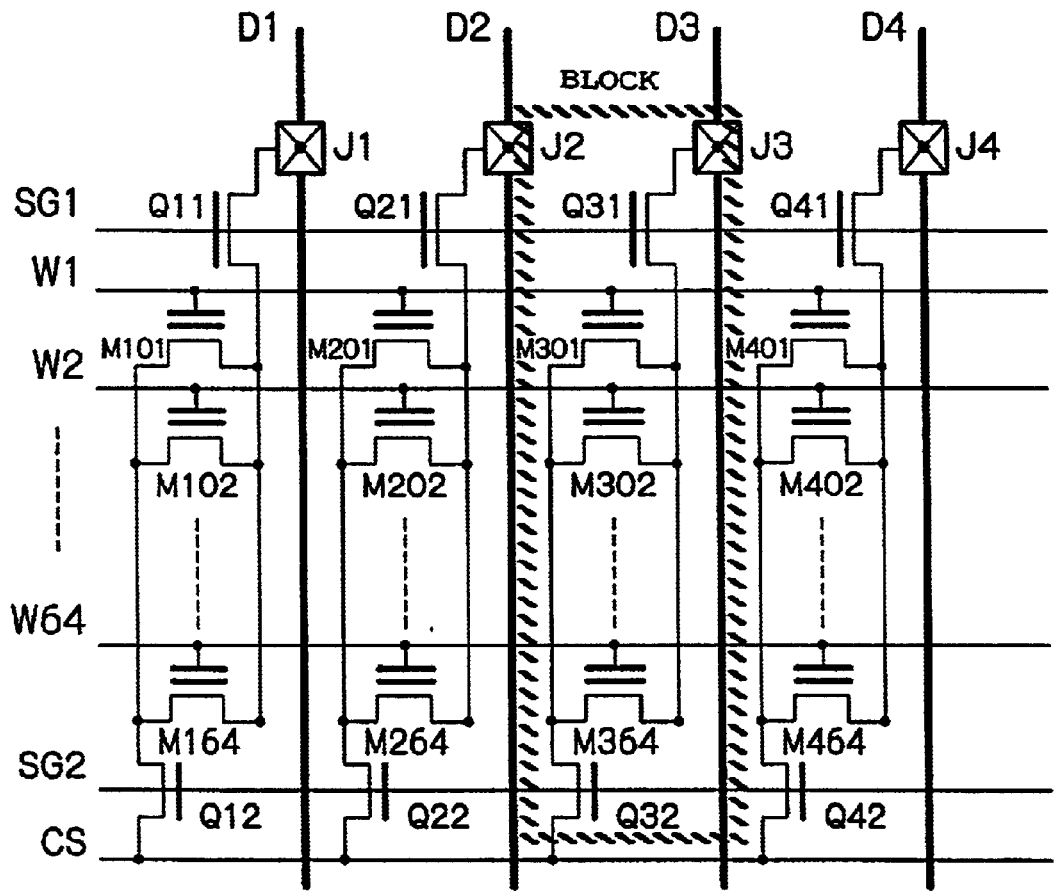
FIG. 1 is a circuit diagram of a memory cell assembly of a flash EEPROM.
Figure 2:
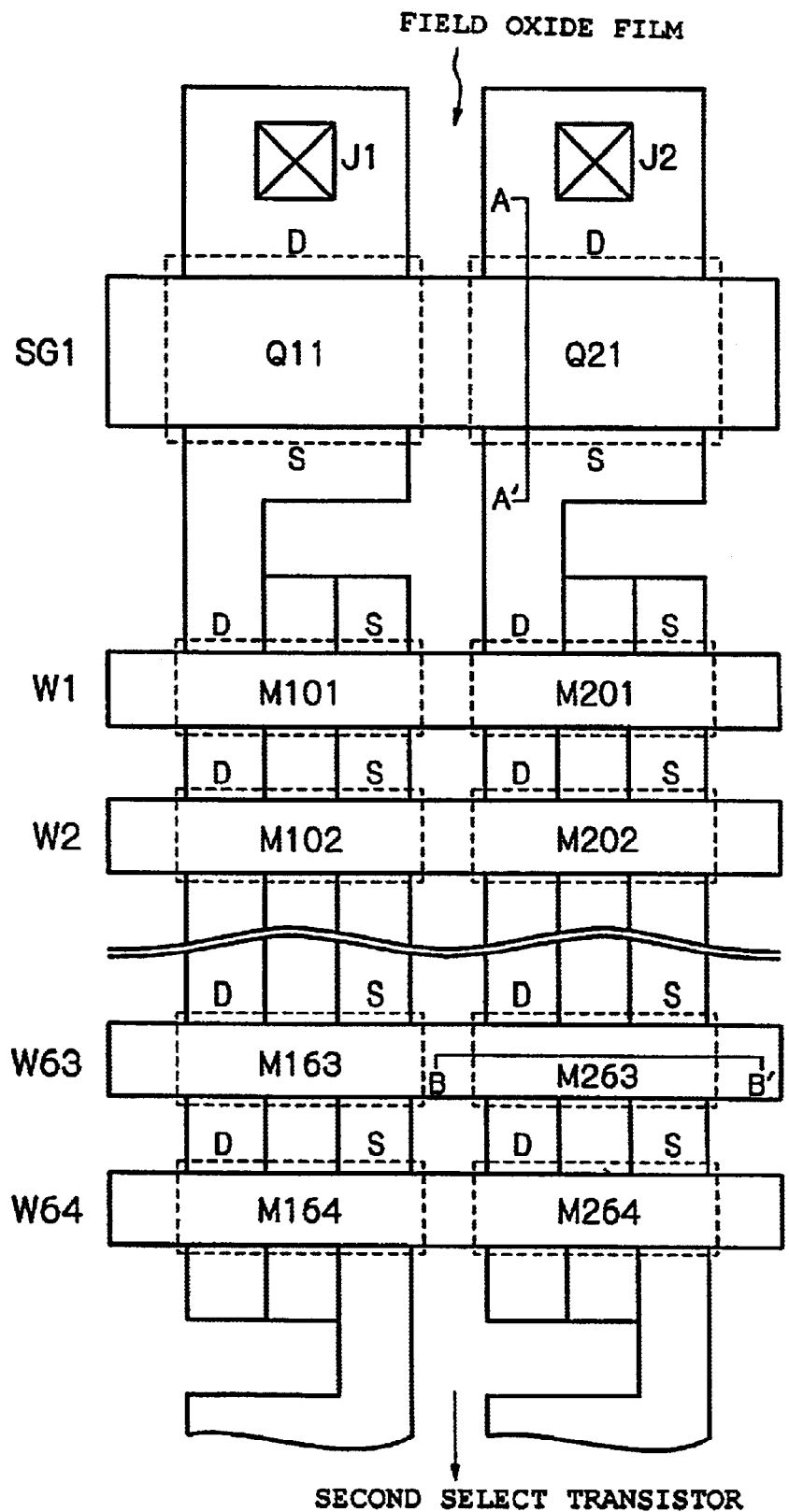
FIG. 2 is a plan view of a structure of the flash EEPROM shown in FIG. 1.
Figure 3:
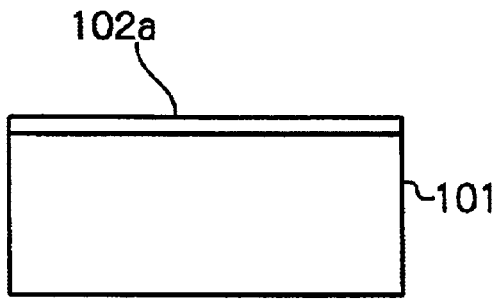
FIGS. 3 through 10 are cross-sectional views showing the sequence of a conventional method of manufacturing the semiconductor memory device shown in FIGS. 1 and 2.
Figure 3:
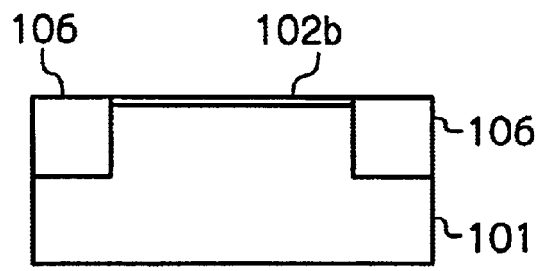
Figure 4:
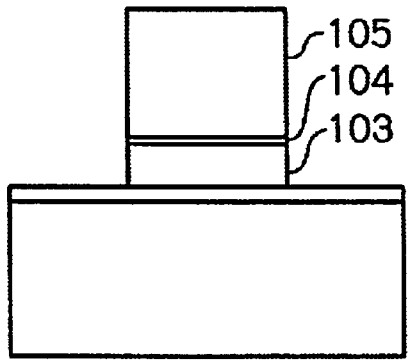
Figure 4:
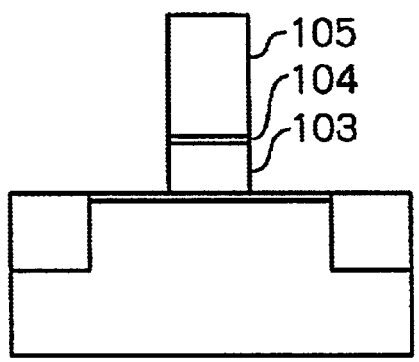
Figure 5:
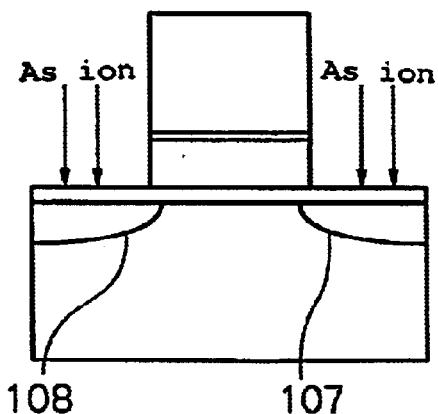
Figure 5:
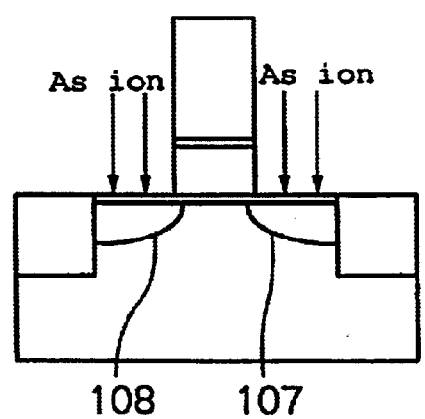
Figure 6:
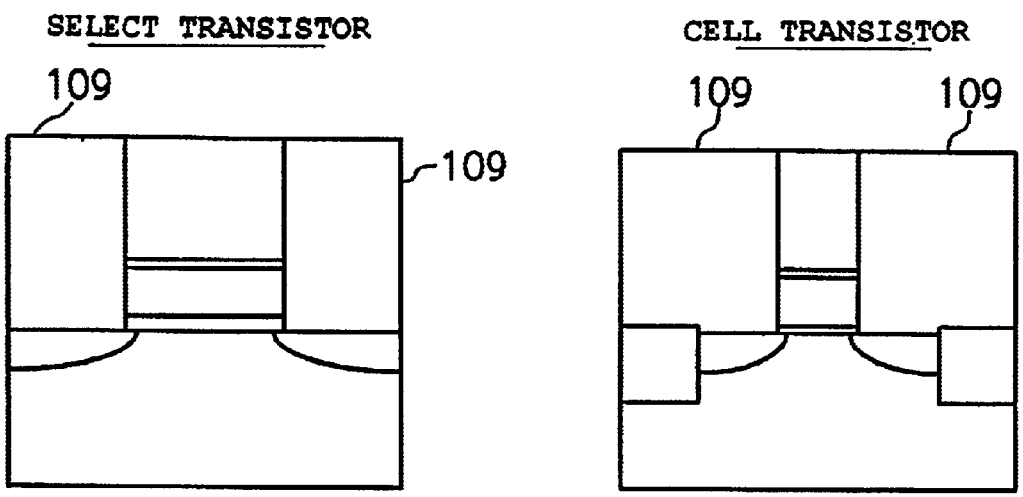
Figure 7:
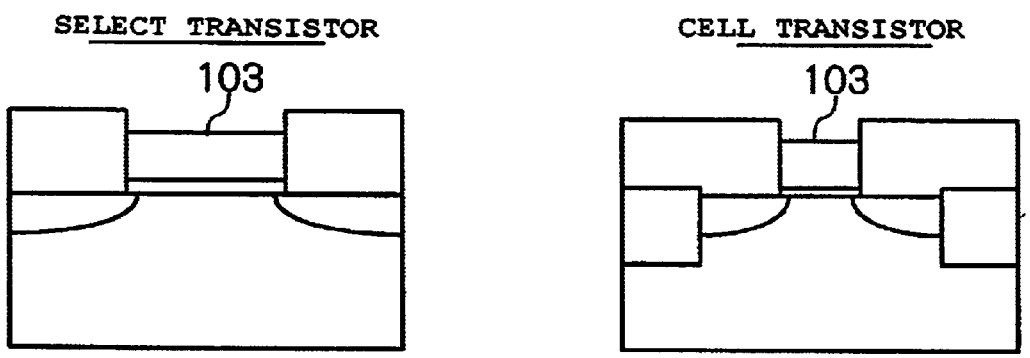
Figure 8:
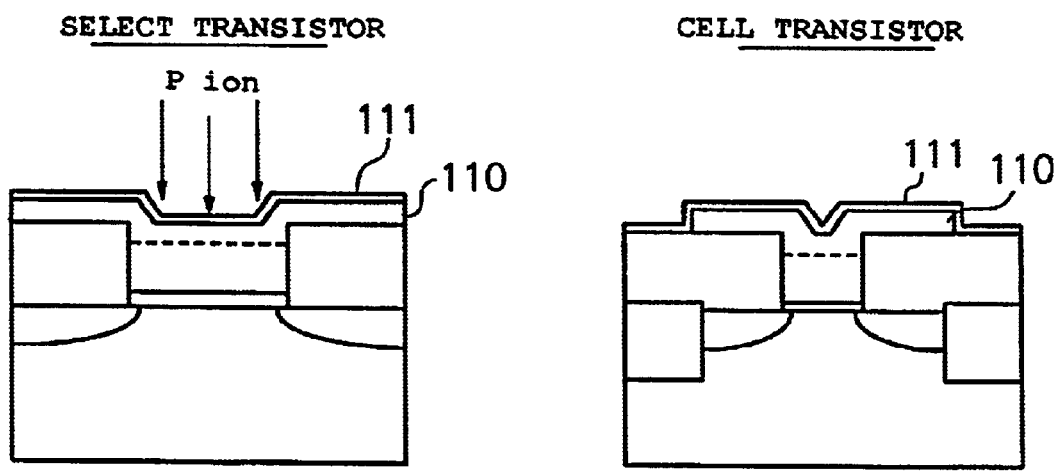
Figure 9:
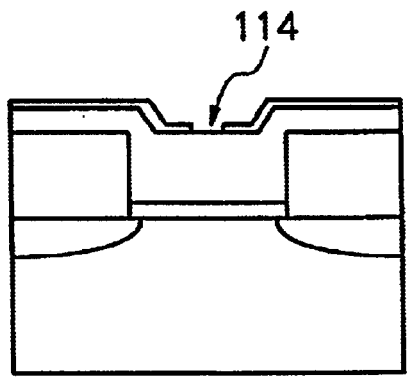
Figure 9:
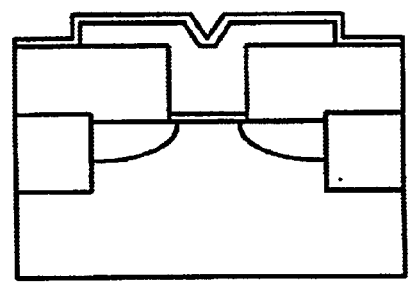
Figure 10:
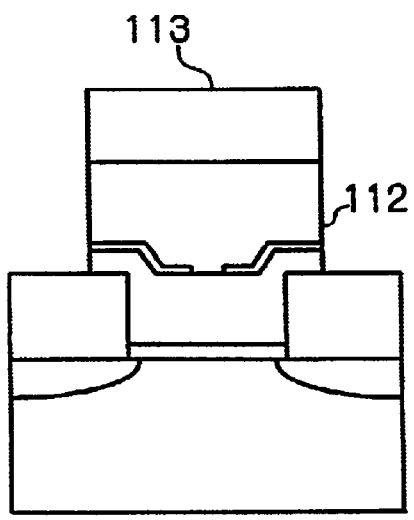
Figure 10:
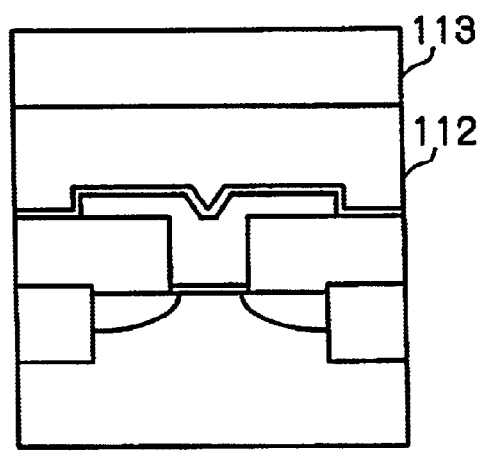
Figure 11A:
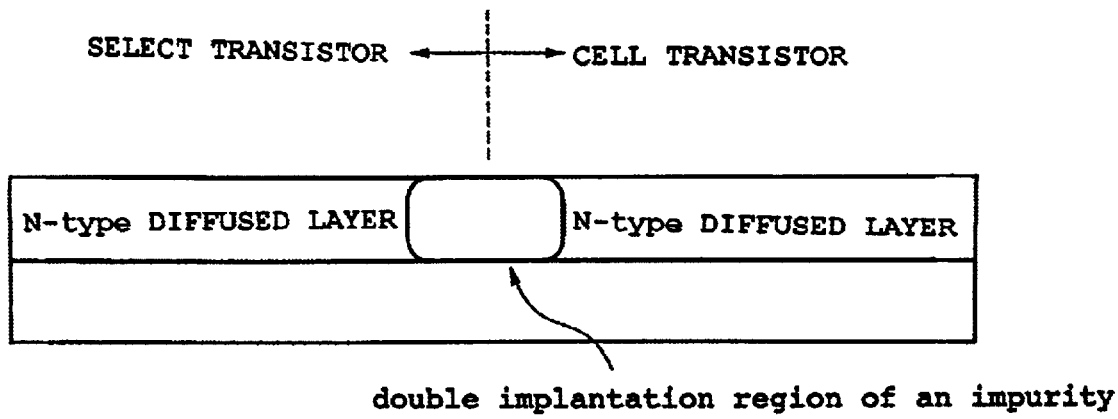
FIGS. 11A and 11B are cross-sectional views showing junctions in the case where a cell transistor and a select transistor of the semiconductor memory device shown in FIGS. 1 and 2 are not fabricated simultaneously.
Figure 11B:
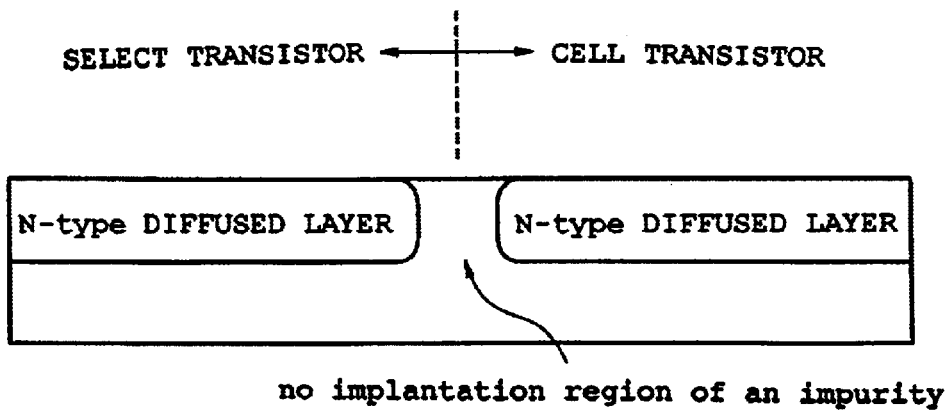
Figure 12:
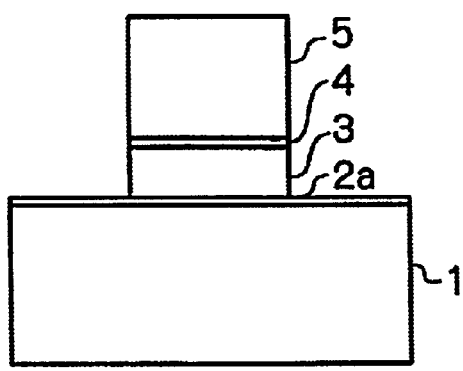
FIGS. 12 through 19 are cross-sectional views showing a process of fabricating a cell transistor and a select transistor, of a method of manufacturing a semiconductor memory device according to the present invention.
Figure 12:
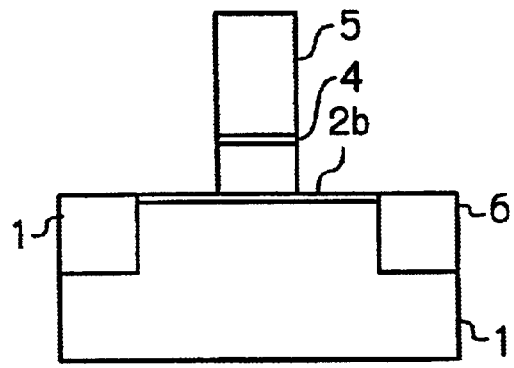

As shown in FIG. 12, a thin $SiO_2$ film and a silicon nitride film is formed on substrate 1 of p-type semiconductor and patterned to a predetermined shape, and its openings are selectively oxidized to form field oxide film 6 as an inactive region for separating components. The inactive region for separating components may be a region of shallow trench isolation (STI).

Then, a silicon oxide ($SiO_2$) film is grown on the surface of substrate 1 by thermal oxidization. Silicon oxide film 2a formed in a select transistor area will be removed in a subsequent step. A silicon oxide film formed in a cell transistor area serves as tunneling oxide film 2b.

First N-type polysilicon film 3, which will serve as the floating gate electrode of a cell transistor, is grown on silicon oxide film 2a and tunneling oxide film 2b. Pad oxide film 4 is grown on first N-type polysilicon film 3 by CVD, and second N-type polysilicon film 5 is grown on pad oxide film 4. Second N-type polysilicon film 5 will be used only as a mask in a subsequent ion implantation step. Therefore, second N-type polysilicon film 5 may be replaced with an amorphous silicon film or a silicon nitride film.

Then, first N-type polysilicon film 3, pad oxide film 4, and second N-type polysilicon film 5 are patterned to respective shapes. The width of first N-type polysilicon film 3 which is formed at this time determines the channel widths of the cell transistor and the select transistor.

Figure 13:
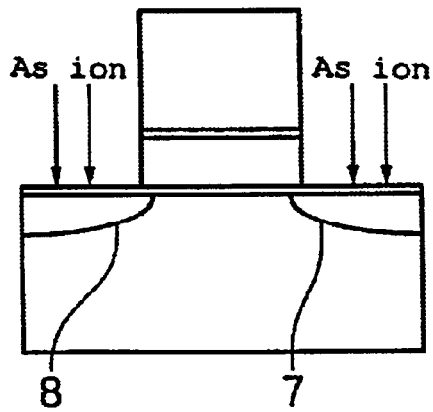
Figure 13:
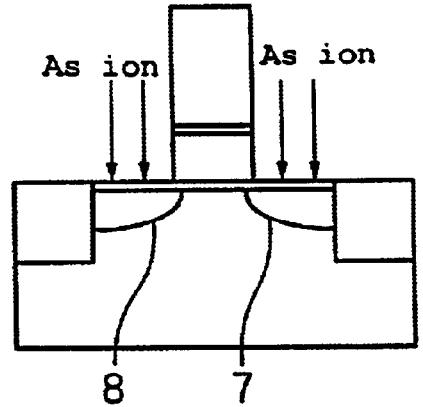

As shown in FIG. 13, using second N-type polysilicon film 5 as a mask, an impurity of arsenic (As), for example, is introduced into substrate 1 by way of ion implantation, and thermally diffused to form source region 7 and drain region 8 of the cell transistor and the select transistor. At this time, side walls may be formed of insulating films on the sides of first N-type polysilicon film 3, pad oxide film 4, and second N-type polysilicon film 5, so that source region 7 and drain region 8, each comprising an N-type diffused layer, are of an LDD (Lightly Doped Drain) structure.

Figure 14:
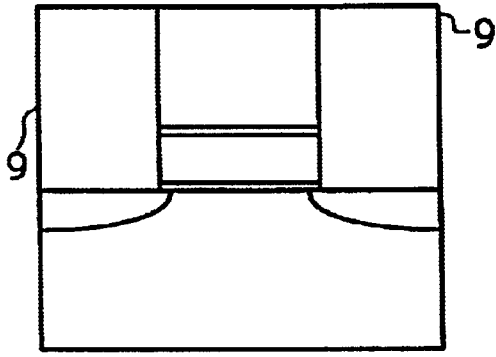
Figure 14:
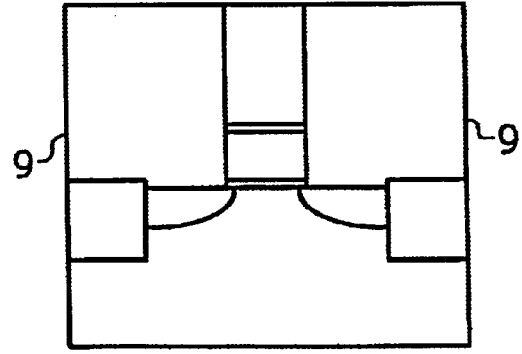

Then, as shown in FIG. 14, over-the-diffused-layer oxide film 9 in the form of a silicon oxide film is grown by plasma CVD so as to fill up regions alongside of first N-type polysilicon film 3, pad oxide film 4, and second N-type polysilicon film 5. Prior to this step, the sides of first N-type polysilicon film 3, pad oxide film 4, and second N-type polysilicon film 5 of the cell transistor are covered with highly reliable thermal oxide films. If side walls are to be formed, then the sides are covered with similar thermal oxide films before the side walls are formed. The sides are covered with such thermal oxide films in order to prevent charges from leaking from first N-type polysilicon film 3 which is the floating gate electrode of the cell transistor into over-the-diffused-layer oxide film 9 and hence to prevent the data retaining capability from being reduced.

Thereafter, the upper surface of over-the-diffused-layer oxide film 9 is planarized by a CMP process and an etchback process, exposing second N-type polysilicon film 5 (see FIG. 14). Depending on how over-the-diffused-layer oxide film 9 fills up the above regions, the upper surface of over-the-diffused-layer oxide film 9 may only be etched back without the CMP process.

Figure 15:
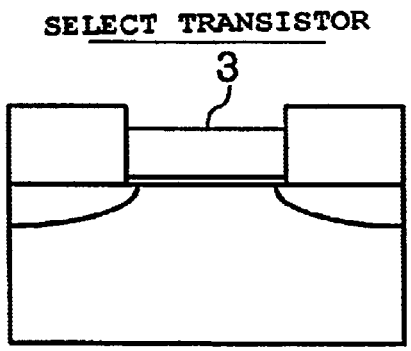
Figure 15:
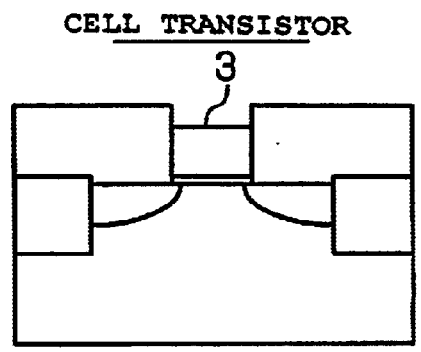

Second N-type polysilicon film 5 and pad oxide film 4 are etched away, exposing the surface of first N-type polysilicon film 3 (see FIG. 15). Prior to this step, over-the-diffused-layer oxide film 9 alongside of first N-type polysilicon film 3 may be etched to adjust its height.

Figure 16:
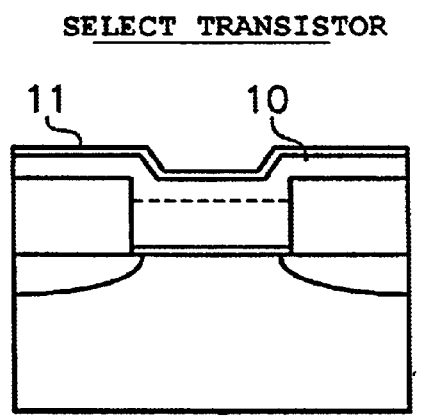
Figure 16:
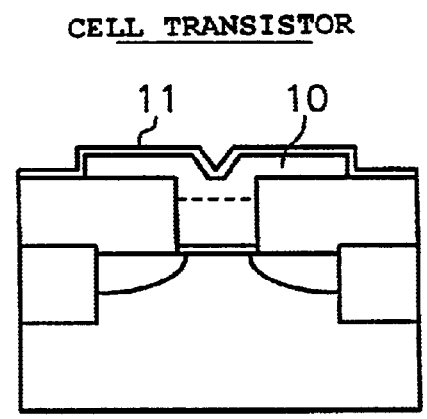

Then, as shown in FIG. 16, third N-type polysilicon film 10 which serves as an upper portion of the floating gate electrode of the cell transistor is grown on first N-type polysilicon film 3. In order to increase the capacitance between the floating gate electrode and a control gate electrode which will subsequently be formed, third N-type polysilicon film 10 in the cell transistor area is patterned to a wing shape, and ONO film 11 is grown on patterned third N-type polysilicon film 10 by CVD.

Figure 17:
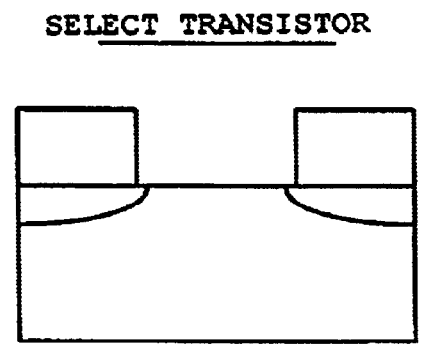
Figure 17:
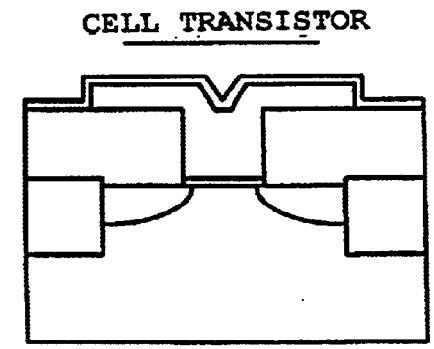

Then, as shown in FIG. 17, ONO film 11, third N-type polysilicon film 10, first N-type polysilicon film 3, and silicon oxide film 2 in the select transistor area are etched away, exposing the surface of substrate 1.

Figure 18:
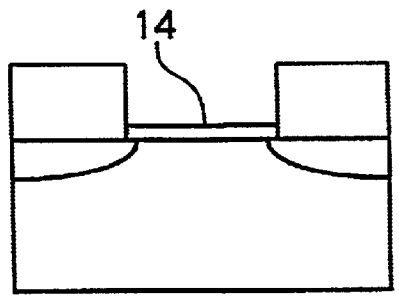
Figure 18:
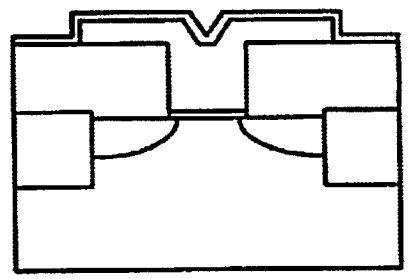
Figure 19:
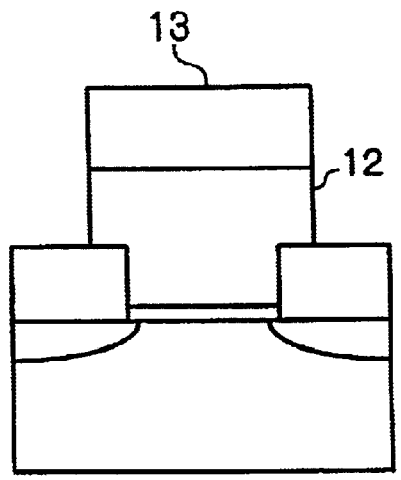
Figure 19:
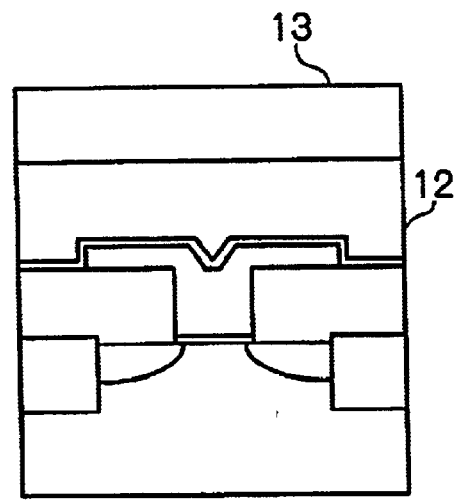

Then, the surface of substrate 1 in the select transistor area is thermally oxidized to form gate insulating film 14 (see FIG. 18). As shown in FIG. 19, fourth N-type polysilicon film 12, which will serve as the gate electrode of the select transistor and the control gate electrode of the cell transistor, is grown on gate insulating film 14 and ONO film 11. Metal silicide film 13 of WSi, for example, is grown on fourth N-type polysilicon film 12.

The cell transistor area and a peripheral circuit area are covered with respective photoresists, and a control gate, ONO film 111, and a floating gate of the cell transistor are patterned simultaneously. Finally, the cell transistor area is covered with a photoresist, and gate electrodes (fourth N-type polysilicon film 12 and metal silicide film 13) of the select transistor and the transistors of the peripheral circuit are patterned, as shown in FIG. 19. Metal silicide film 13 may not necessarily be formed, but only fourth N-type polysilicon film 12 may be grown.

In the above method of manufacturing a semiconductor memory device, since the N-type diffused layer which serves as the source and drain regions of the select transistor and the N-type diffused layer which serves as the source and drain regions of the cell transistor are formed simultaneously, the junction between the select transistor and the cell transistor is prevented from being cut off, and the impurity is prevented from being introduced twice. Because the gate electrode of the select transistor does not have a double-layer N-type polysilicon film unlike the conventional semiconductor memory device, the method according to the present invention is free of the step of short-circuiting two N-type polysilicon films and the step of introducing an impurity in order to reduce the resistance of the first N-type polysilicon film which corresponds to the floating gate electrode of the cell transistor.

Consequently, the film thickness of the gate insulating film of the select transistor can be increased and the concentration of the impurity in the polysilicon film used as the gate electrode of the select transistor can be increased with a reduced number of fabrication steps.

If the transistors of the peripheral circuit are to be fabricated simultaneously with the cell transistor and the select transistor, then transistors of the peripheral circuit are fabricated as follows:

At the same time as the step of fabricating the cell transistor and the select transistor as shown in FIG. 12, a silicon nitride film is formed on a substrate 1 of p-type semiconductor and patterned to a predetermined shape, and its openings are selectively oxidized to form field oxide film 6 as an inactive region for separating components, as shown in FIG. 20.

Then, silicon oxide ($SiO_2$) film 2a and first N-type polysilicon film 3 are grown on substrate 1 by thermal oxidization. Pad oxide film 4 is deposited on N-type polysilicon film 3 by CVD, and second N-type polysilicon film 5 is grown on pad oxide film 4.

Then, at the same time as the step of planarizing over-the-diffused-layer oxide film 9 as shown in FIG. 15, second N-type polysilicon film 5 and pad oxide film 4 are etched away, exposing the surface of first N-type polysilicon film 3, as shown in FIG. 21.

At the same time as the step shown in FIG. 16, third N-type polysilicon film 10 is deposited on first N-type polysilicon film 3, and ONO film 11 is grown on third N-type polysilicon film 10 by CVD, as shown in FIG. 22.

Figure 23:
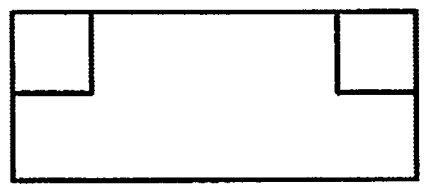
Figure 24:
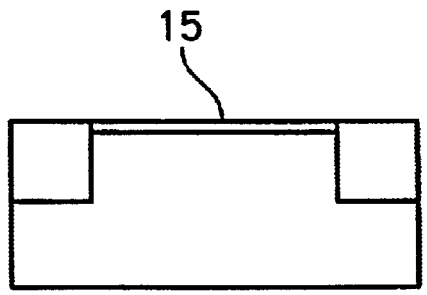
Figure 24:
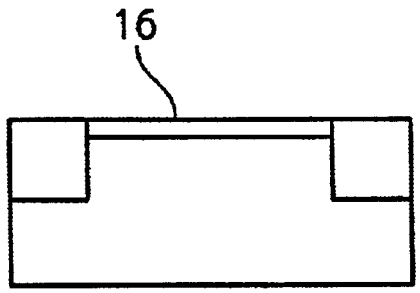

Then, at the same time as the step shown in FIG. 17, ONO film 11, third N-type polysilicon film 10, first N-type polysilicon film 3, and silicon oxide film 2 are etched away, exposing the surface of substrate 1, as shown in FIG. 23.

Then, at the same time as the step shown in FIG. 18, the surface of substrate 1 is thermally oxidized, forming gate insulating films of the transistors of the peripheral circuit. Of the transistors of the peripheral circuit, a high-withstand-voltage transistor which requires a high withstand voltage has gate insulating film 16 (see FIG. 24) whose thickness is increased according to a multi-oxidizing process described below. A Vcc-driven transistor which operates under a power supply voltage Vcc that is supplied from an external source does not need to increase the thickness of gate insulating film 15. According to the multi-oxidizing process, the surface of substrate 1 is thermally oxidized to form an oxide film whose thickness is smaller than a desired film thickness. The thickness of the oxide film is smaller than the desired film thickness by a thickness which will be added when gate insulating film 15 of the Vcc-driven transistor is subsequently to be formed. Then, a photoresist is formed in a high-withstand-voltage transistor area, and the oxide film in the Vcc-driven transistor area is etched away. Then, the photoresist is removed, and the assembly is thermally oxidized until the film thickness of the oxide film of the Vcc-driven transistor reaches a desired film thickness, growing gate insulating film 15 of the Vcc-driven transistor and gate insulating film 16 of the high-withstand-voltage transistor to respective desired film thicknesses (see FIG. 24). The film thickness of gate insulating film 12 of the select transistor is increased in this step in the same manner as with the high-withstand-voltage transistor.

Figure 25:
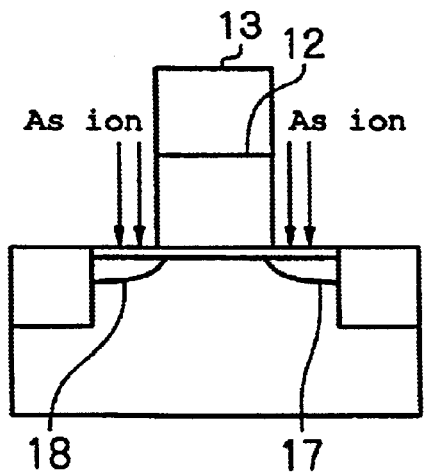
Figure 25:
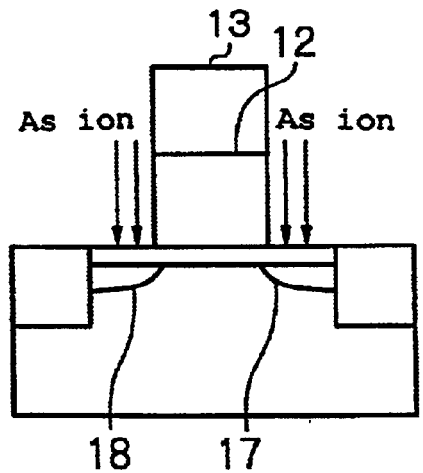

Then, fourth N-type polysilicon film 12 and metal silicide film 13 which will serve as the gate electrodes of the transistors of the peripheral circuit are grown respectively on gate insulating films 15, 16, and then patterned. Finally, as shown in FIG. 25, using the patterned films as a mask, an impurity of arsenic (As), for example, is introduced into substrate 1 by way of ion implantation, and thermally diffused to form source region 17 and drain region 18 of the transistors of the peripheral circuit.

As described above, inasmuch as the process of forming the gate insulating films and gate electrodes of the transistors of the peripheral circuit is carried out simultaneously with the process of fabricating the cell transistor and the select transistor as shown in FIGS. 12 through 19, the number of steps of the method of manufacturing the flash EEPROM can be reduced.

While in the illustrated embodiment the method according to the present invention has been described with respect to N-channel transistors of the semiconductor memory device, the principles of the present invention are also applicable to the fabrication of P-channel transistors by changing the impurity.

While preferred embodiment of the present invention has been described using specific terms, such description is for illustrative purposes only, and it is to be understood that changes and variations may be made without departing from the spirit or scope of the following claims.

What is claimed is:

1. A method of manufacturing a semiconductor memory device capable of electrically writing and erasing data, said semiconductor memory device having a plurality of cell transistors for storing data, each of said cell transistors having a floating gate electrode and a control gate electrode, and a plurality of select transistors for controlling and selecting said cell transistors, said method comprising:

forming a channel region for each said cell transistor and for each said select transistor by forming source regions and drain regions in a substrate by ion implantation;

before forming the control gate electrodes of said cell transistors, exposing a surface of a said substrate directly above said channel regions of said select transistors fabricated in the same process as the cell transistors but not exposing a surface of a substrate directly above said channel regions of said cell transistors;

forming gate insulating films of said select transistors on the exposed surface of the substrate; and forming the control gate electrodes of said cell transistors and forming gate electrodes of select transistors on said gate insulating films.

2. The method of manufacturing a semiconductor memory device according to claim 1, further comprising:

simultaneously forming a first diffused layer serving as source and drain regions of said cell transistors and a second diffused layer serving as source and drain regions of said select transistors.

3. The method of manufacturing a semiconductor memory device according to claim 1, further comprising:

forming gate insulating films of transistors of a peripheral circuit comprising a logic operation circuit, simultaneously with the gate insulating films of said select transistors; and forming gate electrodes of the transistors of said peripheral circuit simultaneously with the gate electrodes of said select transistors.

4. The method of manufacturing a semiconductor memory device according to claim 2, further comprising:

forming gate insulating films of transistors of a peripheral circuit comprising a logic operation circuit, simultaneously with the gate insulating films of said select transistors; and forming gate electrodes of the transistors of said peripheral circuit simultaneously with the gate electrodes of said select transistors.

5. The method of manufacturing a semiconductor memory device according to claim 3, wherein the gate insulating films of said select transistors have a film thickness which is the same as the film thickness of the gate insulating film of a transistor which requires a high withstand voltage, among the transistors of said peripheral circuit.

6. The method of manufacturing a semiconductor memory device according to claim 4, wherein the gate insulating films of said select transistors have a film thickness which is the same as the film thickness of the gate insulating film of a transistor which requires a high withstand voltage, among the transistors of said peripheral circuit.

7. The method of manufacturing a semiconductor memory device according to claim 1, wherein said control gate comprises polysilicon.

8. A method of manufacturing a semiconductor memory device, said method comprising:

forming a first oxide film on a wafer on a first area to contain a plurality of cells transistors in a flash EEPROM (electrically erasable programmable read only memory) and in a second area to contain select transistors, said first oxide film to become a tunneling oxide film for said cells;

forming successively, on said first oxide film in said first area and said second area, a second layer to become a floating gate for said cells, a pad oxide layer as a third layer for said cells, and a fourth layer to serve as a mask material;

etching said second layer, said third layer, and said fourth layer to form ion implant masks for said cell transistors and said select transistors;

forming source and drain diffusion regions for said cell transistors and said select transistors, using said ion implant masks and an ion implant process;

completing a gate structure for said cell transistors; and in a channel region for each said select transistor, stripping off all layers including said first oxide film to expose said channel region.

9. The method of claim 8, further comprising:

completing a gate structure for each said select transistor above its corresponding channel region.

10. The method of claim 9, wherein a third area contains transistors of a peripheral circuit and said first oxide film and said second, third, and fourth layers are formed in said third area, and said stripping exposes regions in said third area to be a channel region, a source diffusion region, and a drain diffusion region for each said peripheral circuit transistor.

11. The method of claim 10, wherein a gate structure for each said peripheral circuit transistor is formed simultaneously to said gate structure for each said select transistor, said method further comprising:

using said peripheral circuit transistor gate structures as an ion implant mask to form said source diffusion regions and said drain diffusion regions of said peripheral circuit transistors.

12. The method of claim 10, wherein said peripheral circuit transistors comprise at least two types of transistors based on a withstand-voltage characteristic, and gate oxide layers of said at least two types of transistors are formed in a multi-oxidation process, thereby forming gate oxide layers of different thicknesses for each said at least two types of transistors.

13. A method of manufacturing a flash EEPROM (electrically erasable programmable read only memory) having cell transistors and select transistors, each said cell transistor and each said select transistor to include a source diffusion region, a drain diffusion region, and a channel region therebetween, said method comprising:

simultaneously forming source diffusion regions, drain diffusion regions, and channel regions for said cell transistors and said select transistors;

successively providing a plurality of layers that allow gate structures to be formed between said source diffusion regions and said drain diffusion regions for said cell transistors, said plurality of layers being additionally provided in regions to contain said select transistors;

and stripping, in regions between said source diffusion regions and said drain diffusion regions of said select transistors, all layers of said plurality of layers to thereby expose channel regions of said select transistors.

14. The method of claim 13, further comprising:
completing gate structures for said select transistors over said exposed channel regions of said select transistors.

15. The method of claim 14, said flash EEPROM additionally including a plurality of transistors in a peripheral circuit, each said peripheral circuit transistor to include a source diffusion region, a drain diffusion region, and a channel therebetween,
wherein said stripping all layers to expose channel regions of said select transistors additionally strips all layers to expose source diffusion regions, drain diffusion regions, and channels of said peripheral circuit transistors.

16. The method of claim 15, wherein gate structures of said peripheral circuit transistors are completed simultaneously with said gate structures of said select transistors.

17. The method of claim 16, further comprising:
forming source diffusion regions and drain diffusion regions for said peripheral circuit transistors with an ion implant process, using said gate structures of said peripheral circuit transistors as an ion implant mask.

18. The method of claim 15, wherein said peripheral circuit transistors comprise at least two types of transistors based on a withstand-voltage characteristic, and gate oxide layers of said at least two types of transistors are formed in a multi-oxidation process, thereby forming gate oxide layers of different thicknesses for each said at least two types of transistors.

* * * * *